(12) United States Patent
Konno

(10) Patent No.: US 7,484,150 B2
(45) Date of Patent: Jan. 27, 2009

(54) SEMICONDUCTOR INTEGRATED CIRCUIT DESIGN APPARATUS AND SEMICONDUCTOR INTEGRATED CIRCUIT DESIGN METHOD

(75) Inventor: Yoshihiro Konno, Tokyo (JP)

(73) Assignee: NEC Corporation, Tokyo (JP)

( * ) Notice: Subject to any disclaimer, the term of this patent is extended or adjusted under 35 U.S.C. 154(b) by 356 days.

(21) Appl. No.: 11/492,797

(22) Filed: Jul. 26, 2006

(65) Prior Publication Data

US 2007/0038910 A1 Feb. 15, 2007

(30) Foreign Application Priority Data

Jul. 29, 2005 (JP) .............................. 2005-220721

(51) Int. Cl.
*G01R 31/28* (2006.01)
(52) U.S. Cl. ........................................ 714/726; 714/30
(58) Field of Classification Search .................... 716/4, 716/5, 18; 714/729, 741, 716, 30
See application file for complete search history.

(56) References Cited

U.S. PATENT DOCUMENTS

| | | | |
|---|---|---|---|
| 5,661,733 A * | 8/1997 | Schoessow | 714/726 |
| 6,301,688 B1 * | 10/2001 | Roy | 716/4 |
| 6,363,520 B1 * | 3/2002 | Boubezari et al. | 716/18 |
| 7,131,081 B2 * | 10/2006 | Wang et al. | 716/4 |
| 7,207,019 B2 * | 4/2007 | Shiota | 716/5 |
| 7,296,249 B2 * | 11/2007 | Rinderknecht et al. | 716/4 |

FOREIGN PATENT DOCUMENTS

JP 2002-131391 5/2002

\* cited by examiner

*Primary Examiner*—David Ton
(74) *Attorney, Agent, or Firm*—McGinn IP Law Group, PLLC

(57) ABSTRACT

A semiconductor integrated circuit design method is a method for designing a semiconductor integrated circuit having a main circuit as well as the spare cell including a scan flip-flop. In the method, a net list is received, which indicates a connection relationship among circuits and their positions in a semiconductor integrated circuit. An observation point is provided in the main circuit shown in the received net list, and then an observation net list in which the observation point is provided, is created. Thereafter, the observation point is associated with a spare cell placed in the neighborhood of the observation point based on the created observation net list. A scan net list is created, in which the observation point and the scan flip-flop included in the spare cell associated with the observation point are connected to each other by wiring.

16 Claims, 11 Drawing Sheets

SEMICONDUCTOR INTEGRATED CIRCUIT DESIGN APPARATUS AND SEMICONDUCTOR INTEGRATED CIRCUIT DESIGN METHOD

BACKGROUND OF THE INVENTION

1. Field of the Invention

The present invention relates to a semiconductor integrated circuit design apparatus and a semiconductor integrated circuit design method.

2. Description of the Related Art

In recent years, the number of circuits included in a semiconductor integrated circuit has been remarkably increased as the semiconductor integrated circuit has been minitualized. This results in difficulty in testing operations of the circuits included in the semiconductor integrated circuit. For this reason, various DFT (Design for Testability) techniques have been developed.

One of the DFT techniques is a scan path method in which scan cells for detecting failure are provided in the semiconductor integrated circuit. In the scan path method, the scan cell is connected to wiring between gates included in the semiconductor integrated circuit. A point on the wiring to which the scan cell is connected is called an observation point. In the scan path method, a test signal is inputted to the semiconductor integrated circuit, and an output signal outputted through the scan cell is detected, whereby an operation of the semiconductor integrated circuit is tested.

However, when the scan cells are provided in the semiconductor integrated circuit, an area of the semiconductor integrated circuit is increased.

Japanese Patent Laid-Open No. 2002-131391 describes a semiconductor integrated circuit in which a spare cell used at the time of correcting the semiconductor integrated circuit is employed as a scan cell. In this semiconductor integrated circuit, since the spare cell is used as the scan cell, this reduces an increase in area of the semiconductor integrated circuit due to provision of a dedicated scan cell in the semiconductor integrated circuit However, in this semiconductor integrated circuit, when the spare cell and the observation point are connected to each other, no consideration is given to the array positions of the spare cell and the observation point, and the length of wiring connecting the spare cell to the observation point. Accordingly, in this semiconductor integrated circuit, when the spare cell and the observation point are connected to each other by the wiring, there is a possibility that the length of the wiring connecting the spare cell to the observation point is increased, so that delay may occur in the operation of the semiconductor integrated circuit.

SUMMARY OF THE INVENTION

An object of the present invention is to provide a semiconductor integrated circuit design apparatus and a semiconductor integrated circuit design method, both capable of reducing delay of a semiconductor integrated circuit when a spare cell is used as a scan cell.

In order to attain the above object, a semiconductor integrated circuit design apparatus of the present invention is a semiconductor integrated circuit for designing a semiconductor integrated circuit having a main circuit as well as the spare cell including a scan flip-flop includes: receiving means which receives a net list indicating a connection relationship among circuits and their positions in a semiconductor integrated circuit; list creating means which creates an observation net list in which the observation point is provided; coordinate extracting means which associates the observation point with a spare cell placed in the neighborhood of the observation point; and a signal connecting means which creates a scan net list in which the observation point is connected, by wiring, to the scan flip-flop included in the spare cell associated with the observation point.

Moreover, a semiconductor integrated circuit design method of the present invention is a method for designing a semiconductor integrated circuit having a main circuit as well as the spare cell including a scan flip-flop. The semiconductor integrated circuit design method includes the steps of: receiving a net list indicating a connection relationship among circuits and their positions in a semiconductor integrated circuit; creating an observation net list in which an observation point is provided in the net list; associating the observation point with a spare cell placed in the neighborhood of the observation point; and creating a scan net list in which the observation point is connected, by wiring, to the scan flip-flop included in the spare cell associated with the observation point.

In the present invention, the observation point is provided in the main circuit shown in the net list and the provided observation point is connected, by the wiring, to the scan flip-flop included in the spare cell placed in the neighborhood of the observation point.

This makes it possible to shorten the length of the wiring connecting the observation point to the scan flip-flop, when the spare cell is used as the scan cell. Accordingly, delay of the semiconductor integrated circuit can be reduced, when the spare cell is used as the scan cell.

Moreover, it is desirable that the number of scan flip-flops shown in the received net list be calculated, and that the observation points of the number corresponding to the calculated number of scan flip-flops be provided.

In the present invention, the observation points of the number corresponding to the number of scan flip-flops shown in the net list are provided. Since this makes it possible to connect all the scan flip-flops to the observation points, the spare cells can be used without waste.

Furthermore, it is desirable: that the main circuit include flip-flops and gates; that a calculation condition be received, the calculation condition used for calculating a reference number from the number of flip-flops and that of gates; that a plurality of candidate points for observation points be provided in the main circuit, after the number of scan flip-flops is calculated; that the number of flip-flops and that of gates, which are connected to each of the candidate points in the neighborhood thereof be calculated; that a reference number of each of the candidate points be calculated from the calculated number of flip-flops and that of gates in accordance with the received calculation condition; and that the candidate points of the number corresponding to the calculated number of scan flip-flops be extracted as the observation points in descending order of the calculated reference number of the candidate point.

In the present invention, the candidate points for the observation points are provided, and the reference number of each of the candidate points is calculated from the number of flip-flops and that of gates, which are connected to each of the provided candidate points in the neighborhood thereof. The candidate points are extracted as the observation points in descending order of the calculated reference number of the candidate point.

Accordingly, it is possible to extract the candidate points as observation points in descending order of the number of flip-flops and that of gates, which are connected to each of the candidate points in the neighborhood thereof. Therefore, when an observation point is provided at the portion, where a large number of flip-flops and gates exist in the neighborhood thereof, in the semiconductor integrated circuit, the operations of many gates can be tested by using one observation point, thereby causing failure testability to be increased.

Furthermore, a semiconductor integrated circuit design apparatus of the present invention for designing a semiconductor integrated circuit having a main circuit as well as the spare cell including a scan flip-flop connected to an observation terminal includes: receiving means which receives a net list indicating a connection relationship among circuits in a semiconductor integrated circuit; list creating means which creates an observation net list where an observation point is provided; signal connecting means creates a connection net list in which the observation point and the observation terminal in the observation net list are connected; optimizing means which lays out the semiconductor integrated circuit shown in the connection net list created by the signal connecting means, and which creates a layout net list indicating a connection relationship among the circuits and their positions in the laid-out semiconductor integrated circuit; coordinates extracting means which associates the observation point with a spare cell placed in the neighborhood of the observation point; and signal switching means which disconnects wiring connecting between the observation point and the observation terminal connected by the signal connecting means, and which connects, by wiring, the observation point to an observation terminal included in the spare cell associated with the observation point by the coordinates extracting means.

Moreover, a semiconductor integrated circuit design method of the present invention for designing a semiconductor integrated circuit having a main circuit as well as the spare cell including a scan flip-flop connected to an observation terminal includes the steps of: receiving a net list indicating a connection relationship among circuits in a semiconductor integrated circuit; creating an observation net list in which an observation point is provided in the net list; connecting the observation point, to the observation terminal; creating a connection net list in which the observation point and the observation terminal are connected; creating a layout net list which the semiconductor integrated circuit is laid-out; associating the observation point with a spare cell placed in the neighborhood of the observation point based on the layout net list; disconnecting wiring connecting the observation point to the observation terminal laid-out; and connecting, by wiring, the observation point to an observation terminal included in the spare cell associated with the observation point.

In the present invention, the connection net list is created, indicating the connection relationship in the semiconductor integrated circuit in which the observation point is connected to the observation terminal connected to the scan flip-flop. The semiconductor integrated circuit shown in the connection net list is laid out, and the wiring connecting the observation point to the observation terminal is thereafter disconnected. Subsequently, the observation point is connected, by the wiring, to the observation terminal included in the spare cell placed in the neighborhood of the relevant observation point.

This makes is possible to shorten the wiring between the observation point and the scan flip-flop even if the net list which does not show the positions of the circuits in the semiconductor integrated circuit is received. Accordingly, it is possible to reduce delay when the spare cell is used as the scan cell.

Moreover, when the net list is received, it is desirable that the number of observation terminals shown in the received net list be calculated, and that the observation points of the number corresponding to the calculated number of observation terminals be provided.

In the present invention, the observation points of the number corresponding to the number of observation terminals are provided. Since this makes it possible to connect all the observation terminals to the observation points when the spare cell is used as the scan cell, the spare cells can be used without waste.

Furthermore, when the connection net list is created, it is desirable that a delay constrained condition for reducing delay of the semiconductor integrated circuit shown in the created connection net list be created, and that the semiconductor integrated circuit shown in the connection net list be laid out so as to satisfy the created delay constrained condition.

In the present invention, the delay constrained condition for reducing the delay is created, and the semiconductor integrated circuit shown in the connection net list is laid out so as to satisfy the created delay constrained condition. Since this makes it possible to satisfy the delay constrained condition when the semiconductor integrated circuit is laid out, the delay of the semiconductor integrated circuit can be reduced.

Moreover, when target failure testability of the semiconductor integrated circuit is stored and the connection net list is created by the signal connection section, it is desirable that failure testability of the semiconductor integrated circuit shown in the created connection net list is calculated, and that it be determined whether or not the calculated failure testability is not less than the target failure testability. When the calculated failure testability is less than the target failure testability, it is also desirable: that the number of observation terminals connected to the scan flip-flop shown in the created connection net list be increased; that an increase net list in which the number of observation terminals is increased be created; that the number of observation terminals shown in the created increase net list be increased after the increase net list is created; and that the observation points of the number corresponding to the calculated number of observation terminals be provided.

In the present invention, when the failure testability is less than the target failure testability, the increase net list is created, in which the number of observation terminals is increased, and the observation points of the number corresponding to that of observation terminals shown in the created increase net list are provided. Since this makes it possible to increase the number of observation points when the failure testability is less than the target failure testability, the failure testability can be increased.

BRIEF DESCRIPTION OF THE DRAWINGS

FIG. 13 is a circuit diagram illustrating a fan-in trace and the like.

DETAILED DESCRIPTION OF THE PREFERRED EMBODIMENTS

The following will explain embodiments of the present invention with reference to the drawings.

First, an explanation will be given of a spare cell included in a semiconductor integrated circuit.

Figure 2:
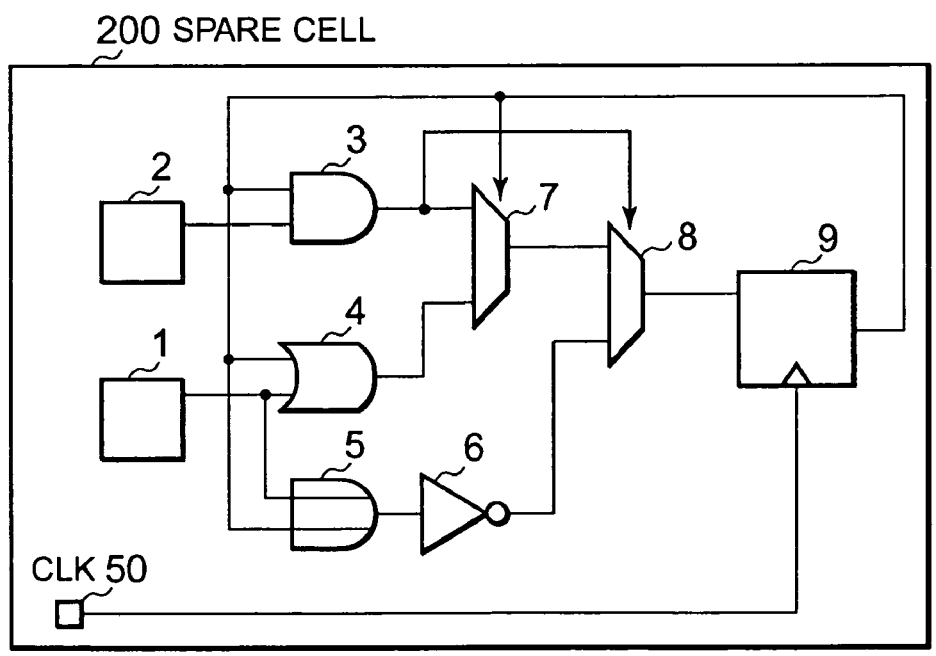
FIG. 2 is a circuit diagram illustrating an example of a spare cell.

FIG. 2 is a circuit diagram illustrating an example of the spare cell included in the semiconductor integrated circuit.

In FIG. 2, a spare cell 200 includes clamp circuits 1 and 2, an AND circuit 3, an OR circuit 4, an EXOR circuit 5, an inverter circuit 6, selectors 7 and 8, a flip-flop 9, and a clock input terminal 50.

The spare cell 200 is included in the semiconductor integrated circuit, and used for a small-scale design change such as the case of logical correction in the final stage of the design process. Moreover, in the case of a design change, various kinds of gates included in the spare cell 200 are used for correcting wiring.

Figure 3:
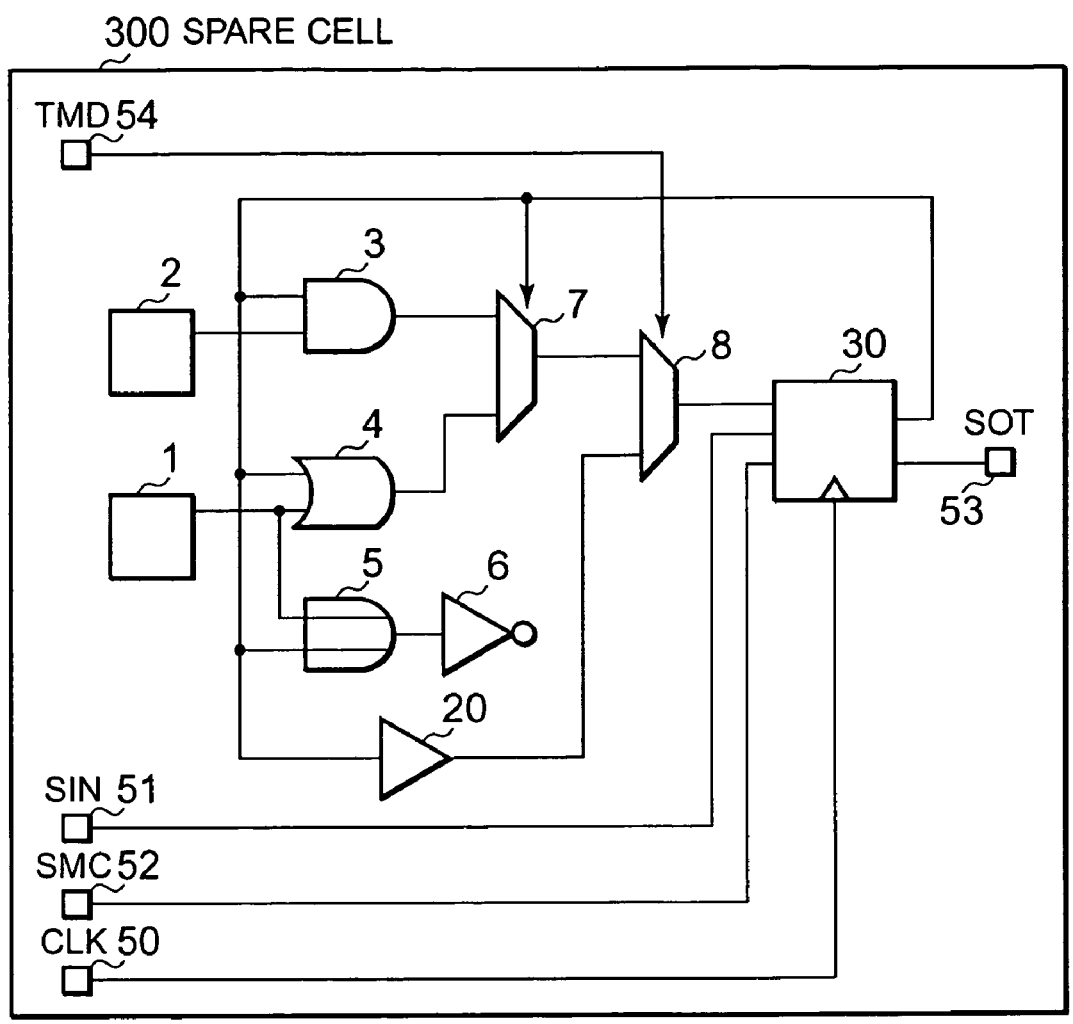
FIG. 3 is a circuit diagram illustrating an example of a spare cell to which a scan function is added.

FIG. 3 is a circuit diagram illustrating an example of spare cells to which a scan function is added. Note that, in FIG. 3, the same reference numerals as those of FIG. 2 are used for the same components as those of FIG. 2.

In FIG. 3, a spare cell 300 includes clamp circuits 1 and 2, an AND circuit 3, an OR circuit 4, an EXOR circuit 5, an inverter circuit 6, selectors 7 and 8, a scan flip-flop 30, and the clock input terminal 50, scan terminals 51 to 53, a test mode signal terminal 54, a buffer circuit 50, and a buffer circuit 20.

The scan flip-flop 30 has the same function as that of the flip-flop 9 and is connected to the scan terminals 51 to 53.

The scan terminal 51 outputs, to the scan flip-flop 30, a scan-in signal which is a signal for testing an operation of a semiconductor integrated circuit.

The test mode signal terminal 54 outputs a test mode signal, which represents either an ON or OFF test mode, to the selector 8 at a preceding stage of the scan flip-flop 30.

The selector 8 is connected to the buffer circuit 20 upon receipt of the test signal indicating an ON test mode.

When the spare cell 300 is used as a scan cell, wiring connecting the EXOR circuit 5 to the buffer circuit 20 is disconnected, and the scan flip-flop 30 is connected to an observation point through the selector 8 and the buffer circuit 20.

The scan flip-flop 30 holds a signal outputted from the selector 8 and outputs the held signal, as a scan-out signal, to the scan terminal 53 in accordance with a pulse signal which the clock input terminal 50 receives. It should be noted that the operation of the semiconductor integrated circuit is tested by use of the scan-out signal outputted from the scan flip-flop 30.

The scan terminal 52 receives a control signal that controls an operation of the scan flip-flop 30, for example, decision making of an output destination of the scan-out signal.

Figure 1:
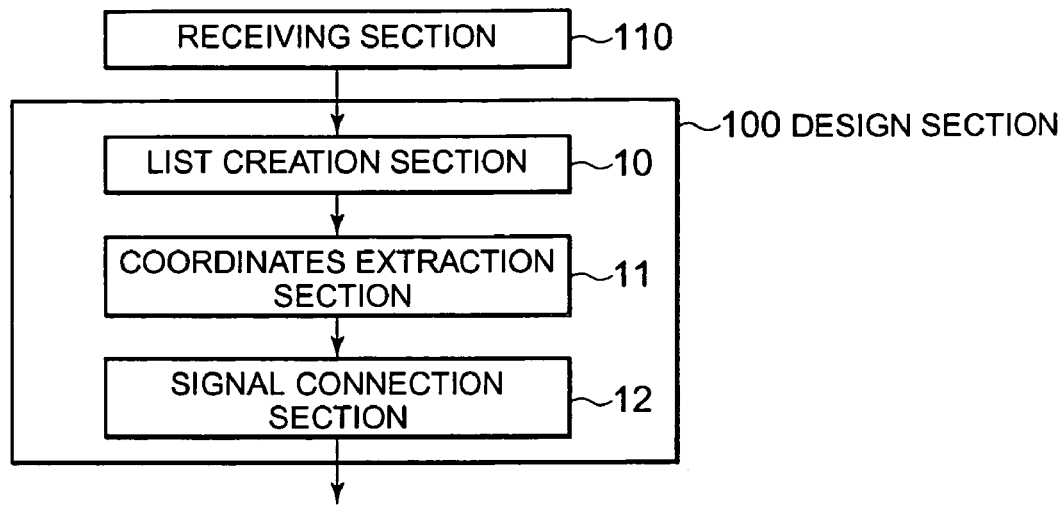
FIG. 1 is a block diagram illustrating a structure of a semiconductor integrated circuit design apparatus according to an embodiment of the present invention.

FIG. 1 is a block diagram illustrating a structure of a semiconductor integrated circuit design apparatus of an embodiment of the present invention. More specifically, this is the block diagram illustrating the structure of the semiconductor integrated circuit design apparatus for designing a semiconductor integrated circuit in which spare cell are used as scan cells based on a net list indicating a connection relationship among circuits and the positions thereof in the semiconductor integrated circuit.

In FIG. 1, the semiconductor integrated circuit design apparatus includes a design section 100 and a receiving section 110.

The receiving section 110 receives a net list A and a calculation condition.

The net list A, herein, shows a connection relationship among circuits, their array positions and wiring among the circuits in the semiconductor integrated circuit including the main circuit as well as the spare cell (for example, the spare cell 300) having the scan flip-flop therein. In addition, the net list A includes a plurality of spare cells. Also, the main circuit includes flip-flops and gates.

The calculation condition is a condition on which a reference number for specifying an observation point in the semiconductor integrated circuit shown in the net list A is calculated from the number of flip-flops and that of gates. For example, the reference number is set to be a sum of the tripled number of flip-flops and the number of gates on the calculation condition.

Upon receipt of the net list A and the calculation condition, the receiving section 110 outputs the received net list A and calculation condition to the design section 100 (specifically, a list creation section 10).

The design section 100 includes the list creation section 10, a coordinates extraction section 11, and a signal connection section 12.

Upon receipt of the net list A and the calculation condition, the list creation section 10 calculates the number of scan flip-flops shown in the received net list A.

After calculating the number of scan flip-flops, the list creation section 10 provides observation points of the number corresponding to the calculated number of scan flip-flops in the main circuit shown in the net list A.

More specifically, the list creation section 10 provides a plurality of candidate points for observation points in the man circuit shown in the received network list A.

After providing the candidate points, the list creation section 10 calculates the number of flip-flops and that of gates, which are connected to the provided candidate points in the neighborhood thereof, for each candidate point.

More specifically, after providing the candidate points, the list creation section 10 first selects one candidate point from the provided candidate points Subsequently, after selecting the candidate point, the list creation section 10 performs a fan-in trace starting from the selected candidate point and ending at the flip-flop, and calculates the number of flip-flops and that of gates placed on the fan-in trace.

The list creation section 10 also performs a fan-out trace starting from the selected candidate point and ending at the flip-flop, and calculates the number of flip-flops and that of gates placed on the fan-out trace.

Furthermore, the list creation section 10 performs a fan-in trace (herein after referred to as a fan-out-and-in trance) starting from each of the gates placed on the fan-out trace, which starts from the selected candidate point and ends at the flip-flop, and ending at the flip-flop, and calculates the number of flip-flops and that of gates placed on the fan-out-and-in trace.

Figure 13:
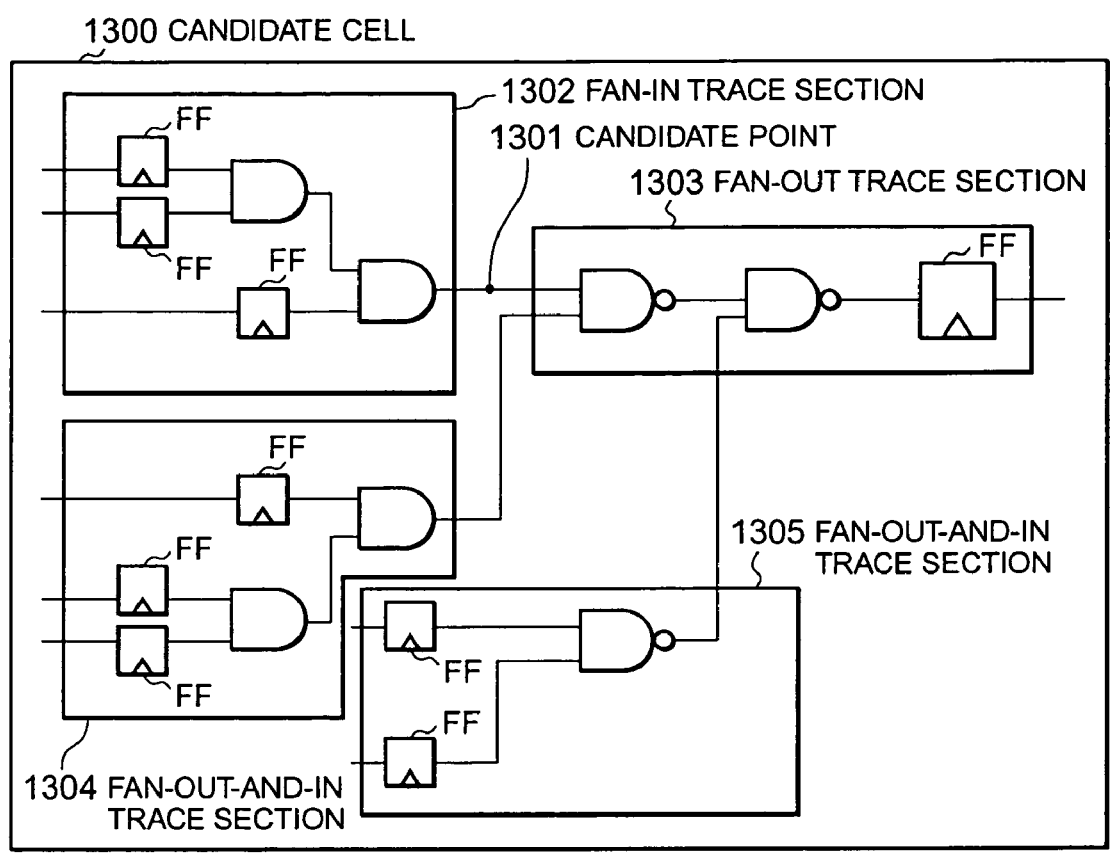

FIG. 13 is a circuit diagram explaining the fan-in trace, the fan-out trace, and the fan-out-and-in trace. In FIG. 13, a candidate circuit 1300 includes a candidate point 1301, a fan-in trace section 1302, a fan-out trace section 1303, and fan-out-and-in trace sections 1304 and 1305.

In the candidate circuit 1300, a part of the main circuit including the candidate point 1301 is shown.

The fan-in trace section 1302 includes flip-flops and gates, which are placed on the fan-in trace starting from the candidate point 1301 and ending at the flip-flop is used as a final point. In this case, the number of flip-flops placed on the fan-in trace is 3 and the number of gates is 2.

The fan-out trace section 1303 includes a flip-flop and gates, which are placed on the fan-out trace starting from the candidate point 1301 and ending at the flip-flop. In this case, the numbers of flip-flops and gates, which are placed on the fan-out trace, are 1 and 2, respectively.

The fan-out-and-in trace sections 1304 and 1305 include flip-flops and gates, which are placed on the fan-out-and-in traces where the fan-in trace is performed from each of the gates included in the fan-out trace section 1303.

In this case, the fan-out-and-in trace 1304 has 3 flip-flops and 2 gates. In addition, the fan-out-and-in trace 1305 has 2 flip-flops and 1 gate.

After calculating the number of flip-flops and that of gates, the list creation section 10 calculates a sum of the number of flip-flops placed on the fan-in trace, the number of flip-flops placed on the fan-out trance, and the number of flip-flops placed on the fan-out-and-in trace, as the number of flip-flops connected to the candidate point in the neighborhood thereof.

Also, the list creation section 10 calculates a sum of the number of gates placed on the fan-in trace, the number of gates placed on the fan-out trance, and the number of gates placed on the fan-out-and-in trace, as the number of gates connected to the candidate point in the neighborhood thereof.

After calculating the number of flip-flops and that of gates, which are connected to the selected candidate point in the neighborhood thereof, the list creation section 10 performs the same processing for all the candidate points to calculate the number of flip-flops and that of the gates, which are connected to the respective candidate points in the neighborhood thereof.

After calculating the number of flip-flops and that of the gates, which are connected to the respective candidate points in the neighborhood thereof, the list creation section 10 calculates a reference number of each of the candidate points from the calculated number of flip-flops and that of gates in accordance with the received calculation condition.

For example, when "the reference number is set to be a sum of the tripled number of flip-flops and the number of gates" in accordance with the calculation condition, the reference number of the candidate point 1301 is 34.

After calculating the reference number for each of the candidate points, the list creation section 10 extracts candidate points as observation points in descending order of the calculated reference number, until the value reaches the calculated number of scan flip-flops.

After providing the observation points, the list creation section 10 creates an observation net list, which indicates a connection relationship among circuits, their array positions and wiring among the circuits in the semiconductor integrated circuit provided with the observation point, and then, outputs the created observation net list A to the coordinates extraction section 11.

Upon receipt of the observation net list A from the list creation section 10, the coordinates extraction section 11 extracts array coordinates of the observation point shown in the observation net list A, and array coordinates of the spare cell shown in the observation net list A based on the received observation net list A. The array coordinates of the spare cell are specifically array coordinates of the scan flip-flop included in the spare cell. The coordinates extraction section 11 associates the observation point with the spare cell so as to shorten the length of wiring connecting the observation point with the spare cell.

Figure 4:
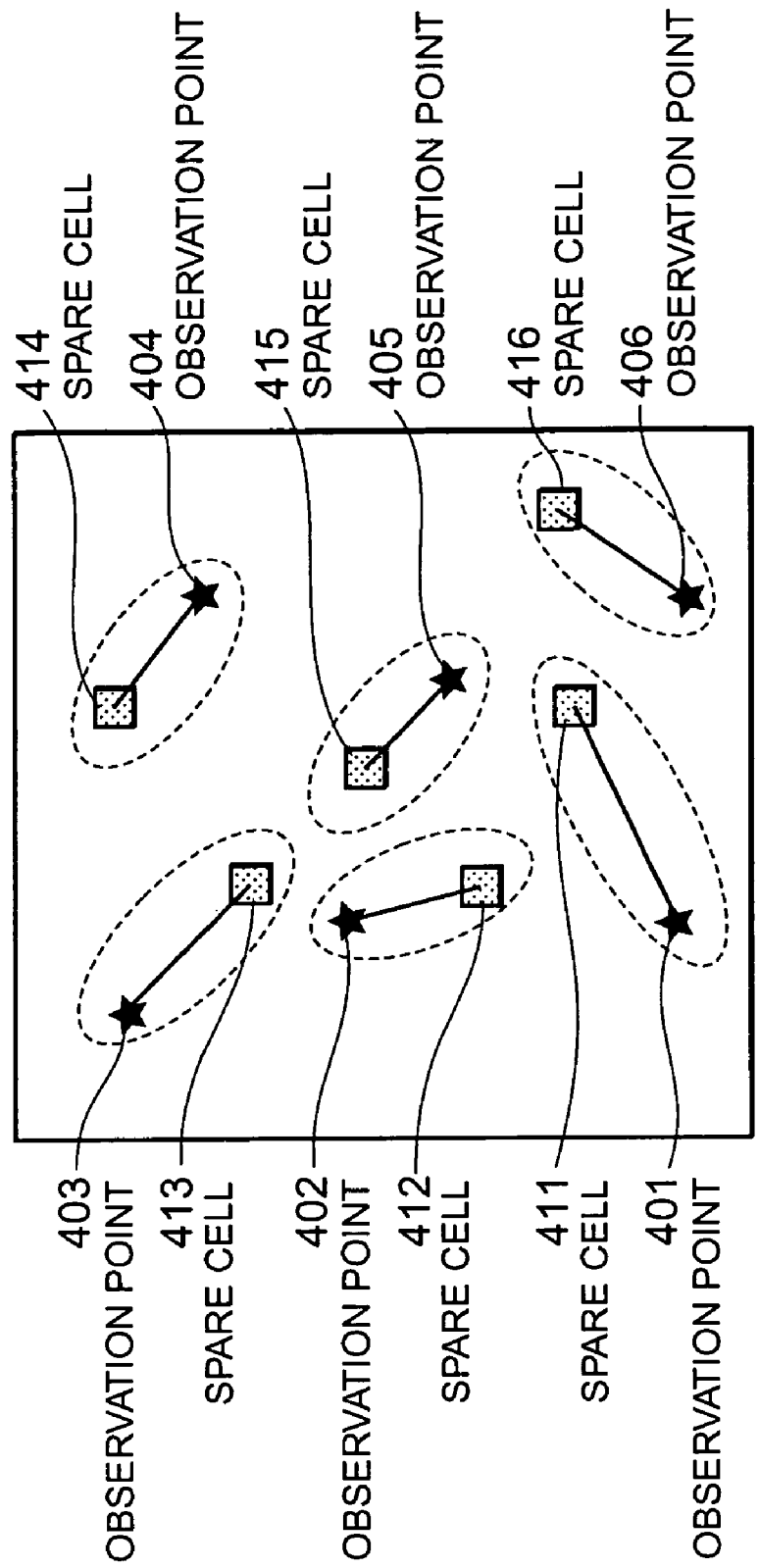
FIG. 4 is an explanatory diagram explaining that the respective observation points and spare cells are associated with one another.

FIG. 4 is an explanatory diagram explaining that the observation points and spare cells are respectively associated with one another. In FIG. 4, the semiconductor integrated circuit includes observation points 401 to 406 and spare cells 411 to 416.

The observation points 401 to 406 are observation points included in the semiconductor integrated circuit.

The spare cells 411 to 416 are spare cells included in the semiconductor integrated circuit.

Each of the observation points and each of the spare cells, which are encircled with a dotted line (for example, the observation point 401 and the spare cell 411), are those associated with each other.

After associating the observation point with the spare cell, the coordinates extraction section 11 creates pair information which specifies the associated observation point and spare cell with each other, and outputs the created pair information and the received observation net list A to the signal connection section 12.

Upon receipt of the pair information and the observation net list A from the coordinates extraction section 11, the signal connection section 12 creates a scan net list A which indicates a connection relationship among circuits, their array positions and wiring among the circuits in the semiconductor integrated circuit in which the observation points are connected, by use of wiring, to the respective spare cells (specifically, the scan flip-flops included in the spare cells) indicated in the pair information, based on the received pair information and observation net list A.

Figure 5:
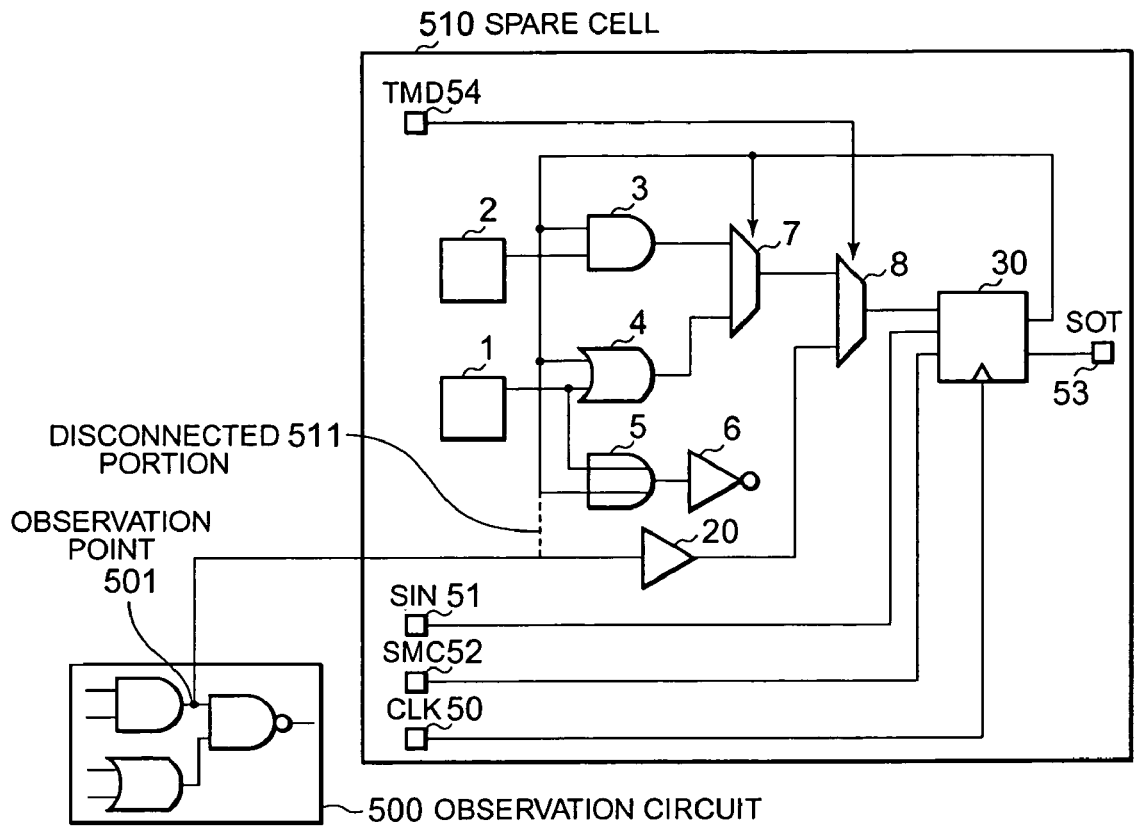
FIG. 5 is an explanatory diagram explaining a connection between the observation point and the spare cell by wiring.

FIG. 5 is an explanatory diagram explaining a connection between an observation point and a spare cell by the wiring. In FIG. 5, the semiconductor integrated circuit includes an observation circuit 500, an observation point 501, a spare cell 510, and a disconnected portion 511.

The observation circuit 500 is a part of the main circuit including the observation point 501.

The spare cell 510 is a circuit in which wiring between the EXOR circuit 5 and the buffer circuit 20 is disconnected at the disconnected portion 511 (dotted line portion) in the spare cell 300.

The signal connection section 12 disconnects the wiring between the EXOR circuit 5 and the buffer circuit 20 at the disconnected portion 511 and connects the observation point 501 to the buffer circuit 20 by the wiring, in order to connect the observation point 501 to the space cell 510 by use of the wiring.

The observation point 501 is thereby connected to the spare cell 510. More specifically, the observation point 501 is connected to the scan flip-flop 30 through the buffer circuit 20 and the selector 8.

After creating the scan net list A, the signal connection section 12 outputs the created scan net list A.

Subsequently, an operation will be explained.

Figure 6:
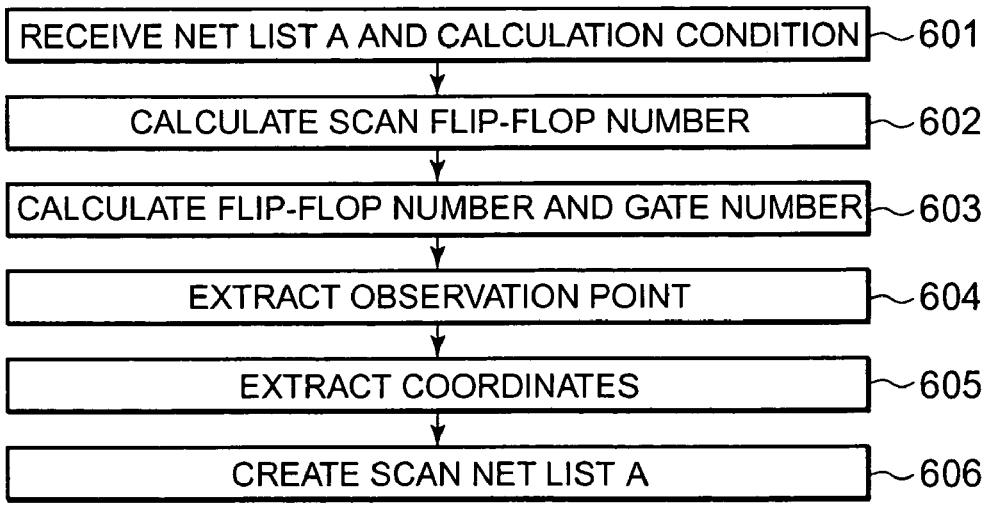
FIG. 6 is a flowchart explaining an operation of the semiconductor integrated circuit design apparatus.

FIG. 6 is a flowchart explaining an operation of the semiconductor integrated circuit design apparatus. More specifically, this is the flowchart to explain an operation performed by the semiconductor integrated circuit design apparatus upon receipt of the net list A.

In step 601, upon receipt of the net list A and the calculation condition, the receiving section 110 outputs the received net list A and the calculation condition to the list creation section 10. Upon receipt of the net list A and the calculation condition, the list creation section 10 executes step 602.

In step 602, the list creation section 10 calculates the number of scan flip-flops shown in the received net list A. After calculating the number of scan flip-flops, the list creation section 10 executes step 603.

In step 603, the list creation section 10 provides a plurality of candidate points as the observation point candidates, in the main circuit shown in the received net list A. After setting the candidate points, the list creation section 10 calculates the number of flip-flops and that of gates, which are connected to the candidate points in the neighborhood thereof, for each of the candidate points. After calculating the number of flip-flops and that of gates, the list creation section 10 executes step 604.

In step 604, the list creation section 10 calculates a reference number of each of the candidate points from the calculated number of flip-flops and that of gates, which are connected to each candidate point in the neighborhood thereof, in accordance with the received calculation condition, and extracts candidate points as observation points in descending order of the calculated reference number of the candidate point, until the number of the extracted points reaches the calculated number of scan flip-flops.

After extracting the observation point, the list creation section 10 creates an observation net list A which indicates a connection relationship among circuits, their array positions and wiring among the circuits in the semiconductor integrated circuit having the extracted observation points, and outputs the created observation net list A to the coordinates extraction section 11. Upon receipt of the observation net list A, the coordinates extraction section 11 executes step 605.

In step 605, based on the received observation net list A, the coordinates extraction section 11 extracts array coordinates of each of the observation points and those of each of the spare cells in the semiconductor integrated circuit shown in the observation net list A.

After extracting the array coordinates of each of the observation points and those of each of the spare cells, the coordinates extraction section 11 associates each of the observation points with each of the spare cells, which are placed in the neighborhood of each of the observation points, based on the extracted array coordinates respectively of the observation points and those of the spare cells.

After associating the observation points with the respective spare cells, the coordinates extraction section 11 creates pair information specifying the observation point and the spare cell, which are associated with each other, and outputs the created pair information and the received observation net list A to the signal connection section 12. Upon receipt of the pair information and observation net list A, the signal connection section 12 executes step 606.

In step 606, the signal connection section 12 creates a scan net list A indicating a connection relationship among circuits, their array positions and wiring among the circuits in the semiconductor integrated circuit in which the observation points are connected, by use of wiring, to the respective spare cells shown in the pair information based on the received pair information and observation net list A, and then, outputs the created scan net list A.

In this embodiment, the receiving section 110 receives the net list A indicating the connection relationship among circuits, and their array positions in the semiconductor integrated circuit having the main circuit as well as the spare cell including the scan flip-flop. The list creation section 10 provides the observation points in the main circuit shown in the net list A, and creates the observation net list A indicating the connection relationship among circuits, and their array positions in the semiconductor integrated circuit having the observation points. The coordinates extraction section 11 associates each of the observation points with each of the spare cells placed in the neighborhood of the concerned observation point based on the observation net list A. The signal connection section 12 creates the scan net list A indicating the connection relationship among circuits and their array positions in the semiconductor integrated circuit in which the observation points are connected, by use of the wiring, to the respective scan flip-flops included in the spare cell associated with the observation point.

As a result, the observation point is provided in the main circuit shown in the net list and the provided observation point is connected to the scan flip-flop included in the spare cell placed in the neighborhood of the observation point by use of the wiring.

This makes it possible to shorten the wiring connecting the observation point to the scan flip-flop when the spare cell is used as the scan cell. This also makes it possible to reduce delay of the semiconductor integrated circuit when the spare cell is used as the scan cell.

Moreover, in this embodiment, the list creation section 10 calculates the number of scan flip-flops shown in the net list A and provides the observation points of the number corresponding to the calculated number of scan flip-flops.

Accordingly, the observation points of the number corresponding to that of scan flip-flops shown in the net list A are provided. Since this makes it possible to connect all scan flip-flops to the observation points, the spare cells can be used without waste.

Furthermore, in this embodiment, the list creation section 10 provides candidate points for observation points in the main circuit shown in the net list A, and calculates the number of flip-flops and that of gates, which are connected to the provided candidate points in the neighborhood thereof, for each candidate point. The list creation section 10 calculates the reference number of each of the candidate points from the calculated number of flip-flops and that of gates in accordance with the calculation condition which the receiving section 110 receives, and extracts the observation points in descending order of the calculated reference number of the candidate points, until of the number of extracted points corresponds to that of scan flip-flops.

As a result, the candidate points serving as observation point candidates are provided and the reference number of each of the candidate points is calculated from the number of flip-flops and that of gates, which are connected to the provided candidate points in the neighborhood thereof. The candidate points are extracted as observation points in descending order of the calculated reference number.

Accordingly, it is made possible to extract the candidate points as observation points in descending order of the number of flip-flops and that of gates, which are connected to the candidate point in the neighborhood thereof. When the observation point is provided at the portion where a large number of flip-flops and gates are located in the neighborhood thereof in the semiconductor integrated circuit, the operations of many gates can be tested using one observation point, thereby causing failure testability to be increased.

Figure 7:
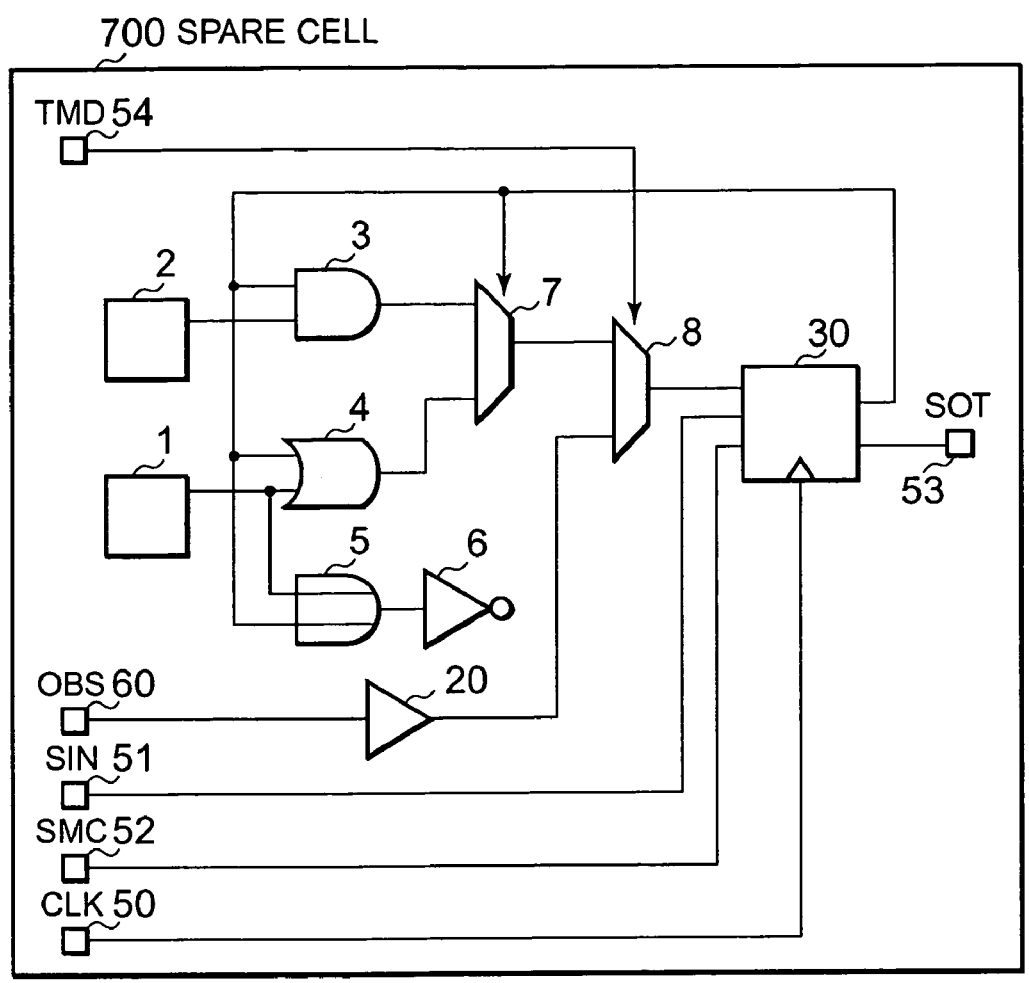
FIG. 7 is a circuit diagram illustrating another example of a spare cell to which a scan function is added.

FIG. 7 is a circuit diagram showing another example of a spare cell to which a scan function is added. The structural components different from those of FIGS. 2 and 3 will be mainly explained below. Note that, in FIG. 7, the same reference numerals as those of FIG. 3 are used for the same components as those of FIG. 3.

In FIG. 7, a spare cell 700 further includes an observation terminal 60 in addition to the structural components of the spare cell 300.

Although the scan flip-flop 30 of the spare cell 300 shown in FIG. 3 is connected to the flip-flop itself through the selector 8 and the buffer circuit 20, the scan flip-flop 30 of the spare cell 700 is connected to the observation terminal 60 through the selector 8 and the buffer circuit 20.

Figure 8:
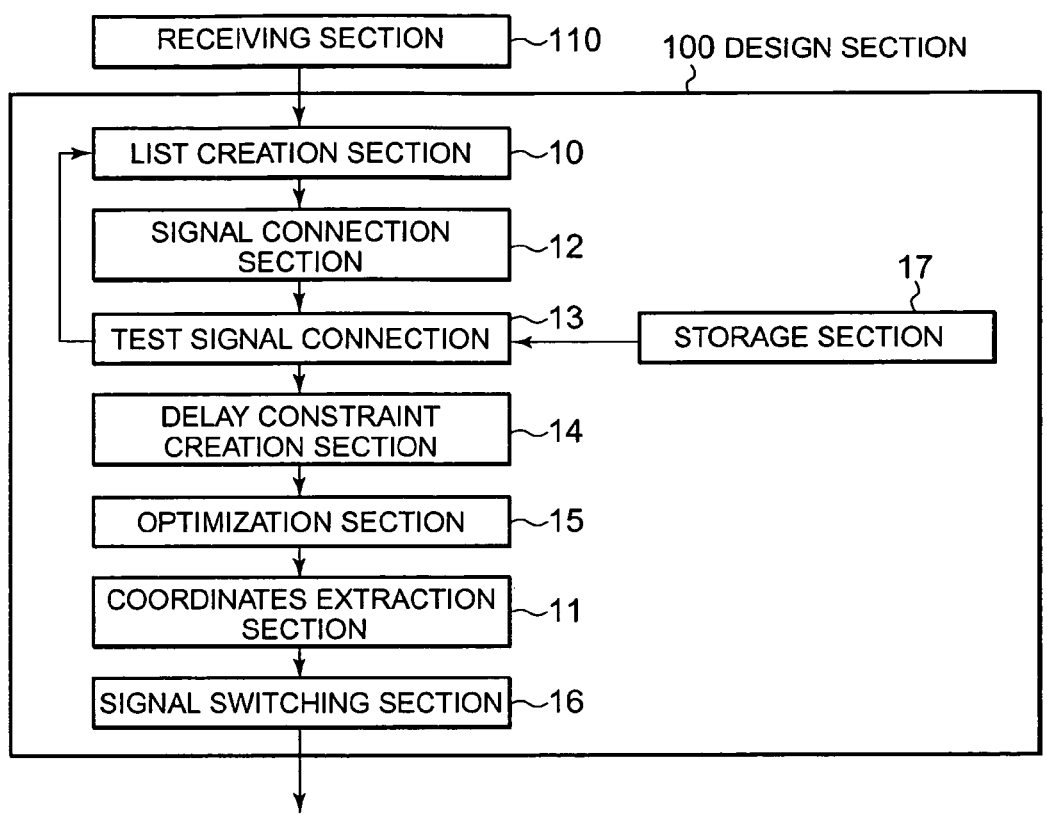
FIG. 8 is a block diagram illustrating the structure of a semiconductor integrated circuit design apparatus according to another embodiment of the present invention.

FIG. 8 is a block diagram illustrating the structure of the semiconductor integrated circuit design apparatus of another embodiment of the present invention. More specifically, this is the block diagram illustrating the structure of the semiconductor integrated circuit design apparatus for designing the semiconductor integrated circuit where the spare cell is used as the scan cell based on the net list indicating the connection relationship among circuits in the semiconductor integrated circuit. The following will explain the structural components which are different from those of FIG. 1. In FIG. 8, the same reference numerals as those of FIG. 1 are added to the same components as those of FIG. 1.

In FIG. 8, the semiconductor integrated circuit design apparatus includes the design section 100 and the receiving section 110.

Upon receipt of a net list B and a calculation condition, the receiving section 110 outputs the received net list B and the calculation condition to the design section 100 (specifically, list creation section 10).

The net list B, herein, shows a connection relationship among circuits in the semiconductor integrated circuit including the main circuit as well as the spare cell (for example, the spare cell 700) having the scan flip-flop connected to the observation terminal. In addition, the net list B includes a plurality of spare cells. Also, the main circuit includes flip-flops and gates.

The design section 100 includes the list creation section 10, the coordinates extraction section 11, the signal connection section 12, a test mode signal connection section 13, a delay restriction creating section 14, an optimization section 15, a signal switching section 16, and a storage section 17.

Upon receipt of the net list B and the calculation condition, the list creation section 10 calculates the number of observation terminals shown in the received net list B.

After calculating the number of observation terminals, the list creation section 10 provides the observation points of the number corresponding to the calculated number of observation terminals in the main circuit shown in the net list B. More specifically, the list creation section 10 performs the processing explained with reference to FIGS. 1 and 6, and provides the observation points of the number corresponding to the calculated number of observation terminals.

After providing the observation points, the list creation section 10 creates an observation net list B indicating a connection relationship among circuits in the semiconductor integrated circuit in which the observation points are provided, and outputs the created observation net list B to the signal connection section 12.

Upon receipt of the observation net list B from the list creation section 10, the signal connection section 12 connects the observation points to the respective observation terminals based on the received observation net list B, and creates a connection net list B indicating a connection relationship among circuits in the semiconductor integrated circuit in which the observation points are connected to the respective observation terminals.

After creating the connection net list B, the signal connection section 12 outputs the created connection net list B to the test mode signal connection section 13.

Upon receipt of the connection net list B from the signal connection section 12, the test mode signal connection section 13 calculates failure testability of the semiconductor integrated circuit shown in the received connection net list B.

More specifically, the test mode signal connection section 13 connects a test mode signal terminal included in the semiconductor integrated circuit shown in the received connection net list B, to a test gate (not shown) through which a test mode signal is outputted, and calculates the failure testability.

The storage section 17 stores target failure testability as a target value for the failure testability.

After calculating the failure testability, the test mode signal connection section 13 determines whether or not the calculated failure testability is not less than the target failure testability stored in the storage section 17.

When the calculated failure testability is less than the target failure testability, the test mode signal connection 13 increases the number of observation terminals, creates a terminal increase net list B indicating a connection relationship among circuits in the semiconductor integrated circuit in which the number of observation terminals is increased, and outputs the created terminal increase net list B to the list creation section 10.

Figure 9:
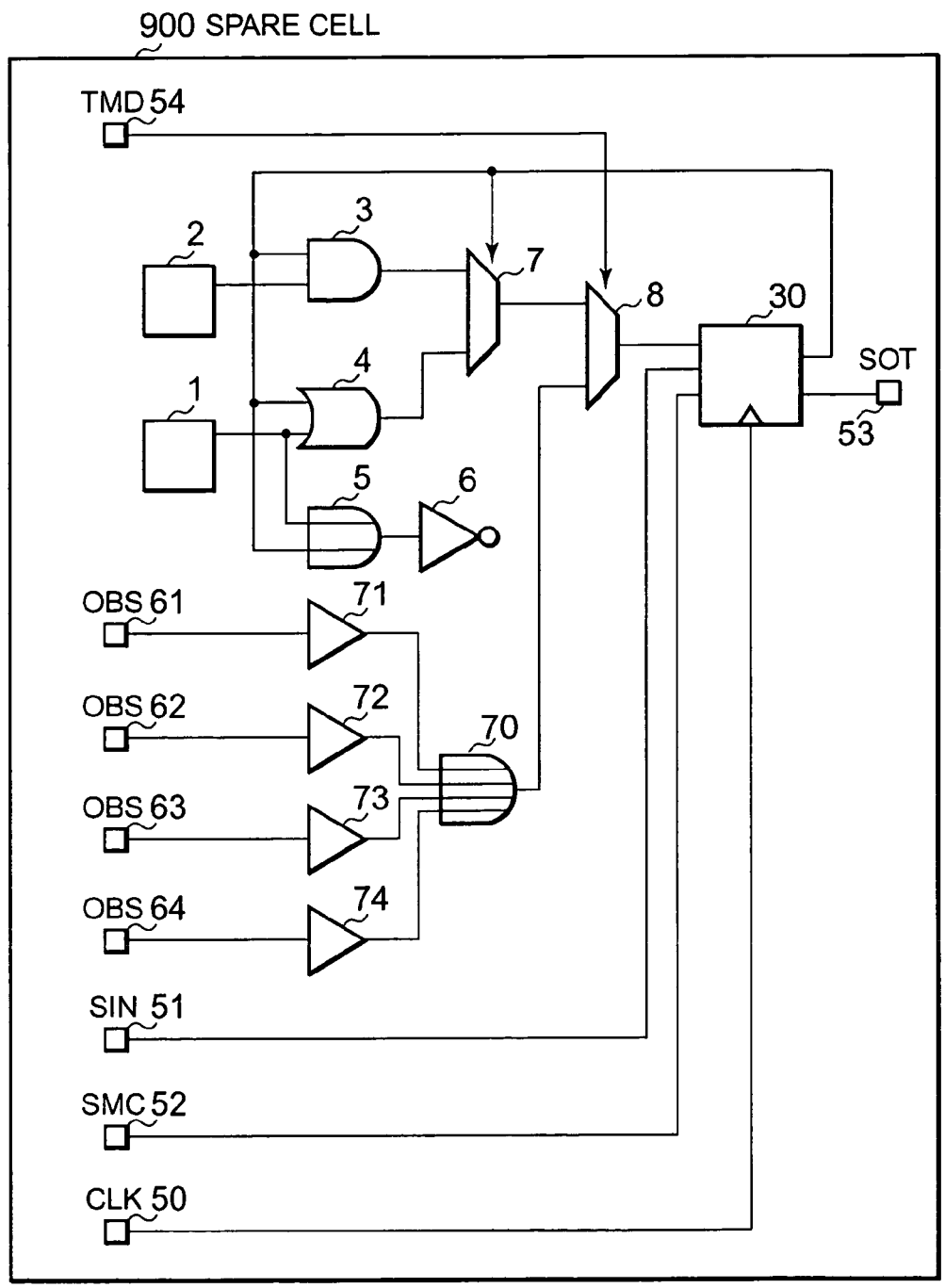
FIG. 9 is a circuit diagram illustrating an example of a spare cell in which the number of observation terminals is increased.

FIG. 9 is a circuit diagram illustrating an example of a spare cell in which the number of observation terminals is increased. In FIG. 9, the spare cell 900 includes an EXOR circuit 70, buffer circuits 71 to 74 and observation terminals 61 to 64 in addition to the structural components shown in FIG. 7.

Although the scan flip-flop 30 of FIG. 7 is connected to one observation terminal 60, the scan flip-flop 30 of FIG. 9 is connected to four observation terminals 61 to 64 through the EXOR circuit 70.

Upon receipt of the terminal increase net list B from the test mode signal connection section 13, the list creation section 10 calculates the number of observation terminals shown in the received terminal increase net list B.

On the other hand, when the calculated failure testability is not less than the target failure testability, the test mode signal connection 13 outputs the received connection net list B to the delay restriction creation 14.

Upon receipt of the connection net list B, the delay constraint creation section 14 creates a delay constrained condition for reducing delay of the semiconductor integrated circuit shown in the received connection net list B.

Figure 10A:
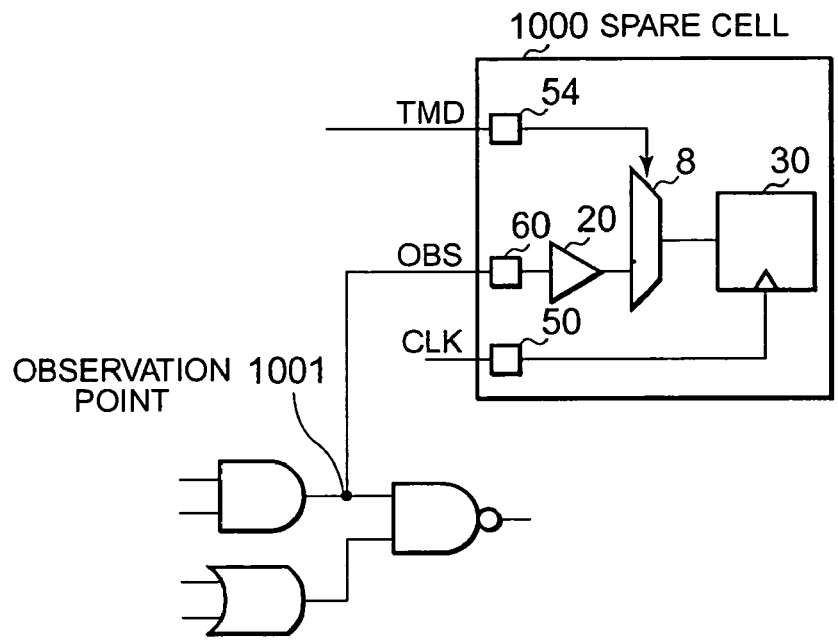
FIG. 10A is an explanatory diagram explaining a delay constrained condition.
Figure 10B:
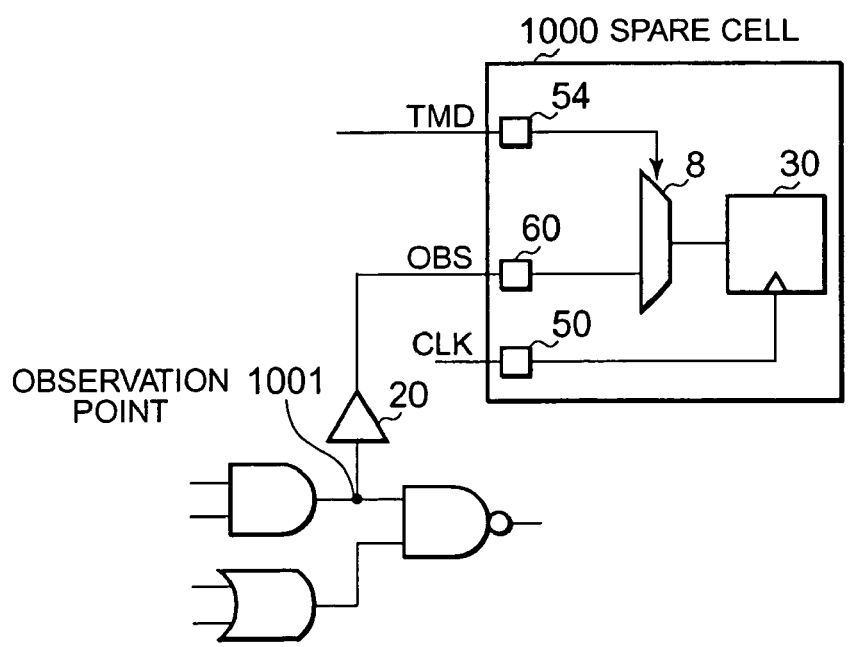
FIG. 10B is an explanatory diagram explaining a delay constrained condition.

FIGS. 10A and 10B are explanatory diagrams each explaining a delay constrained condition. More specifically, FIG. 10A is a diagram illustrating a connection between an observation point and a spare cell, the connection not satisfying the delay constrained condition, and FIG. 10B is a diagram illustrating a connection between an observation point and a spare cell, the connection satisfying the delay constrained condition.

In FIG. 10A, a semiconductor integrated circuit includes a spare cell 1000 and an observation point 1001. Moreover, the spare cell 1000 includes the selector 8, the scan flip-flop 30, a clock input terminal 50, a test mode signal terminal 54, the buffer circuit 20, and the observation terminal 60.

In FIG. 10B, a semiconductor integrated circuit includes the spare cell 1000, the observation point 1001, and the buffer circuit 20. Moreover, the spare cell 1000 includes the selector 8, the scan flip-flop 30, the clock input terminal 50, the test mode signal terminal 54, and the observation terminal 60.

In FIG. 10A, the buffer circuit 20 is disposed between the observation terminal 60 and the selector 8. This increases the length of wiring connecting the observation point 1001 to the buffer circuit 20 to cause delay in the semiconductor integrated circuit, in a general operation of the semiconductor integrated circuit. In order to overcome this delay, the delay constraint creation section 14 creates, as delay constrained condition, a condition for disposing the buffer 20 between the observation point 1001 and the observation terminal 60 as shown in FIG. 10B.

After creating the delay constrained condition, the delay constraint creation section 14 outputs the created delay constrained condition and the received connection net list B to the optimization section 15.

Upon receipt of the delay constrained condition and the connection net list B from the delay constraint creation section 14, the optimization section 15 lays out the semiconductor integrated circuit shown in the received connection net list B so as to satisfy the received delay constrained condition, and creates an optimized layout net list B indicating a connection relationship among circuits, their array positions and wiring among the circuits in the laid-out semiconductor integrated circuit.

After creating the optimized layout net list B, the optimization section 15 outputs the created optimized net list B to the coordinates extraction section 11.

Upon receipt of the optimized layout net list B from the optimization section 15, the coordinates extraction section 11 extracts array coordinates of the observation points and array coordinates of the spare cells (specifically, the observation terminals included in the spare cells) based on the received optimized layout net list B.

After extracting the array coordinates, the coordinates extraction section 11 creates array information in which each of the extracted array coordinates is associated with the observation point or spare cell which is arrayed on the array coordinates, and outputs the created array information and the received optimized layout net list B to the signal switching section 16.

Upon receipt of the array information and the optimized layout net list B from the coordinates extraction section 11, the signal switching section 16 disconnects the wiring connecting the observation point to the spare cell as shown in the optimized layout net list B.

After disconnecting the wiring, the signal switching section 16 connects, by use of the wiring, each of the observation points to each of the spare cells, both placed in the neighborhood thereof, based on the received array information, and creates a scan net list B indicating a connection relationship among circuits, their array positions and wiring among the circuits in the semiconductor integrated circuit in which the observation points are connected, by use of the wiring, to the respective spare cells, both placed in the neighborhood thereof.

Figure 11A:
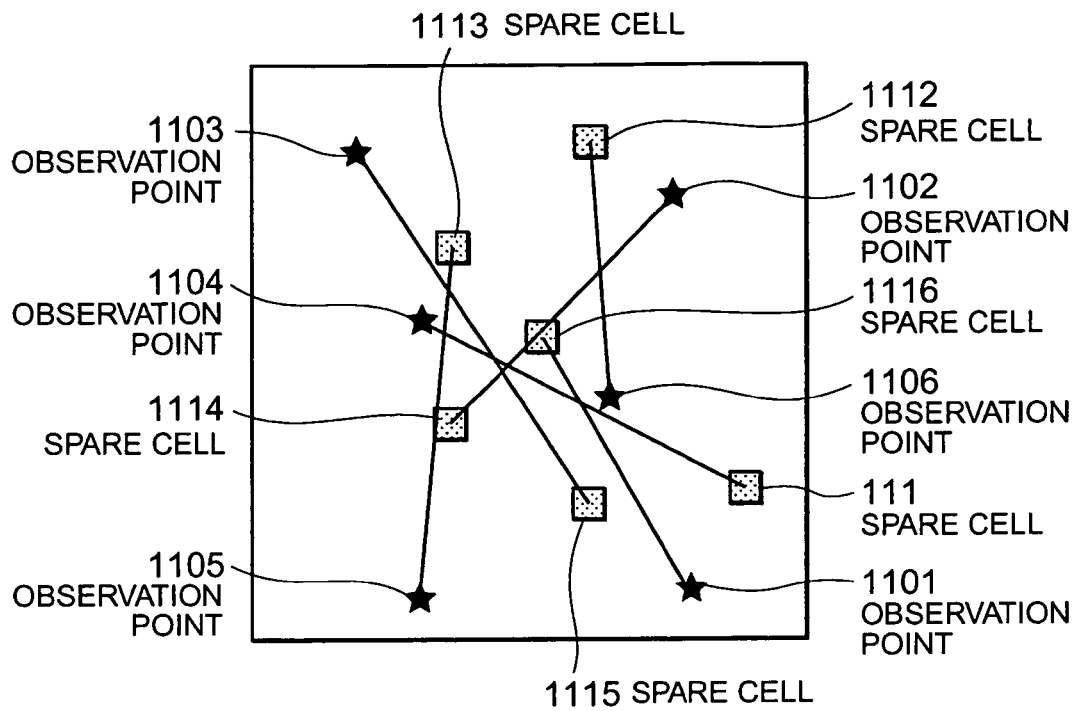
FIG. 11A is an explanatory diagram explaining a change in connections between the observation points and the respective observation terminals.
Figure 11B:
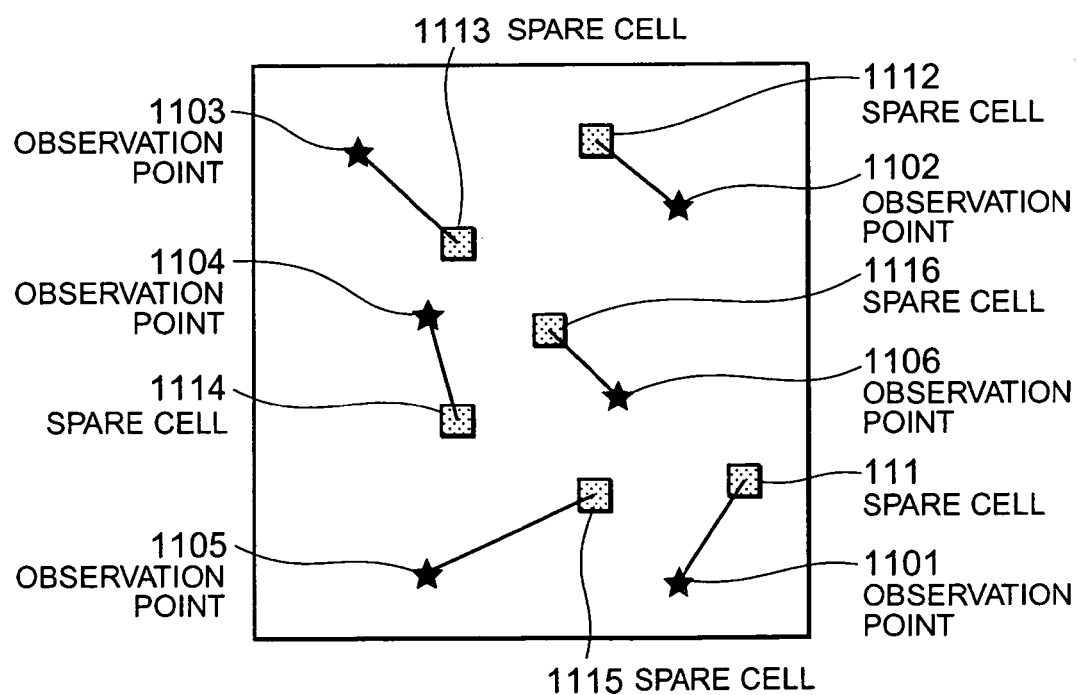
FIG. 11B is an explanatory diagram explaining a change in connections between the observation points and the respective observation terminals.

FIGS. 11A and 11B are explanatory diagrams each explaining switching of a connection between an observation point and an observation terminal. More specifically, FIG. 11A shows the connections between the observation points and the respective observation terminals before switching, and FIG. 11B shows the connections between the observation points and the respective observation terminals after switching.

In FIGS. 11A and 11B, the semiconductor integrated circuit includes observation points 1101 to 1105 and spare cells 1111 to 1115.

In FIG. 11A, for example, the observation point 1101 is connected to the spare cell 1115 by the wiring.

The signal switching section 16 disconnects the wiring connecting the observation point 1101 to the spare cell 1115, and connects the observation point 1101 to the spare cell 1111 placed in the neighborhood thereof, by the wiring. The signal switching section 16 performs the same processing for all the observation points and connects each of the observation points to each of the spare cells placed in the neighborhood of the concerned observation point, by use of the wiring.

After creating the scan net list B, the signal switching section 16 outputs the created scan net list B.

An operation will be next explained.

Figure 12:
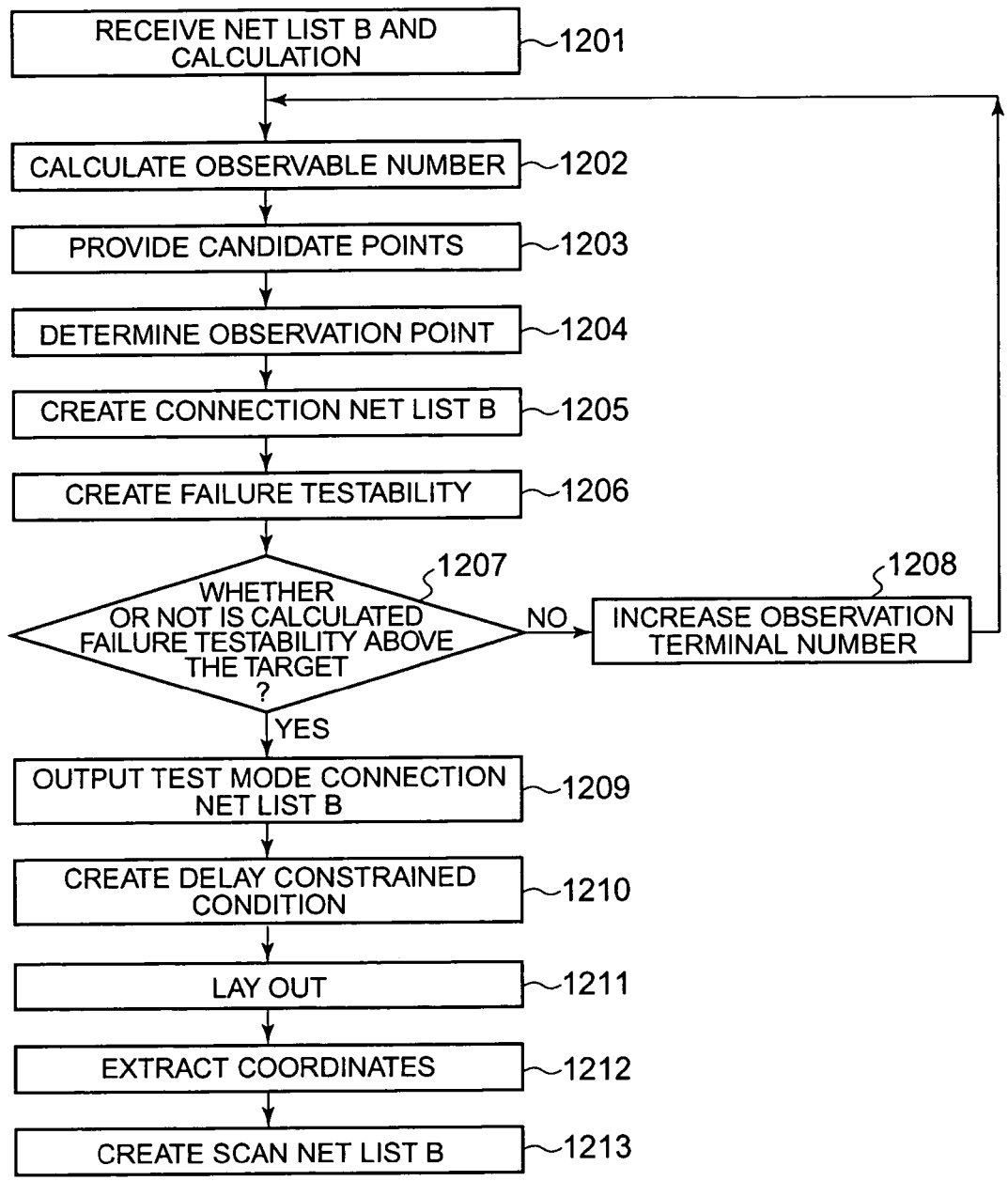
FIG. 12 is a flowchart explaining another operation of the semiconductor integrated circuit design apparatus.

FIG. 12 is a flowchart explaining an operation of the semiconductor integrated circuit design apparatus. More specifically, this is the flowchart to explain an operation performed by the semiconductor integrated circuit design apparatus upon receipt of the net list B.

In step 1201, upon the receipt of the net list B and the calculation condition, the receiving section 110 outputs the received net list B and the calculation condition to the list creation section 10. Upon receipt of the net list B and the calculation condition, the list creation section 10 executes step 1202.

In step 1202, the list creation section 10 calculates the number of observation terminals shown in the received net list B. After calculating the number of observation terminals, the list creation section 10 executes step 1203.

In step 1203, the list creation section 10 provides a plurality of candidate points for the observation points in the main circuit is shown by the received net list B.

After providing the candidate points, the list creation section 10 calculates the number of flip-flops and that of gates, which are connected to each of the provided candidate points in the neighborhood thereof. After calculating the number of flip-flops and that of gates, the list creation section 10 executes step 1204.

In step 1204, the list creation section 10 calculates the reference number of each of the candidate points from the calculated number of flip-flops and that of gates in accordance with the received calculation condition, and extracts candidate points as observation points in descending order of the calculated reference number of the candidate point, until the number of extracted points reaches the calculated number of observation terminals.

After extracting the observation points, the list creation section 10 creates an observation net list B indicating a connection relationship among circuits in the semiconductor integrated circuit in which the extracted observation points are provided, and outputs the created observation net list B to the signal connection section 12. Upon receipt of the observation net list B, the signal connection section 12 executes step 1205.

In step 1205, the signal connection section 12 creates a connection net list B indicating a connection relationship among circuits in the semiconductor integrated circuit in which the observation points and the respective observation terminals are connected based on the received observation net list B.

After creating the connection net list B, the signal connection section 12 outputs the created connection net list B to the test mode signal connection section 13. Upon receipt of the connection net list B, the test mode signal section 13 executes step 1206.

In step 1206, the test mode signal connection section 13 calculates failure testability of the semiconductor integrated circuit shown in the received connection net list B. After calculating the failure testability, the test mode signal connection section 13 executes step 1207.

In step 1207, the test mode signal connection section 13 determines whether or not the calculated failure testability is not less than the target failure testability stored in the storage section 17. When the calculated failure testability is less than the target failure testability, the test mode signal connection section 13 executes step 1208, and when the calculated failure testability is not less than the target failure testability, the test mode signal connection section 13 executes step 1209.

In step 1208, the test mode signal connection section 13 increases the number of observation terminals included in the received connection net list B, and creates a terminal increase net list B which indicates a connection relationship among circuits in the semiconductor integrated circuit in which the number of observation terminals is increased.

After creating the terminal increase net list B, the test mode signal connection section 13 outputs the created terminal increase net list B, as the net list B, to the list creation section 10. Upon receipt of the net list B, the list creation section 10 executes step 1202.

In step S1209, the test mode signal connection section 13 outputs the received connection net list B to the delay constraint creation section 14. Upon-receipt of the connection net list B, the delay constraint creation section 14 executes step 1210.

In step 1210, the delay constraint creation section 14 creates a delay constrained condition for reducing delay of the semiconductor integrated circuit shown in the received connection net list B, and outputs the created delay constrained condition and the received connection net list B to the optimization section 15. Upon receipt of the delay constrained condition and the connection net list B, the optimization section 15 executes step 1211.

In step 1211, the optimization section 15 lays out the semiconductor integrated circuit shown in the received connection net list B so as to satisfy the received delay constrained condition, and creates an optimized layout net list B indicating a connection relationship among circuits, their array positions and wiring among the circuits in the laid-out semiconductor integrated circuit.

After creating the optimized layout net list B, the delay constraint creation section 14 outputs the created optimized layout net list B to the coordinates extraction section 11. Upon receipt of the optimized layout net list B, the coordinates extraction section 11 executes step 1212.

In step 1212, the coordinates extraction section 11 extracts array coordinates of the observation points and those of the observation terminals based on the received optimized layout net list B.

After extracting the array coordinates, the coordinates extraction section 11 creates array information in which each of the extracted array coordinates is associated with each of the observation points or spare cells arrayed on the array coordinates, and outputs the created array information and the received optimized layout net list B to the signal switching section 16. Upon receipt of the array information and the optimized layout net list B, the signal switching section 16 executes step 1213.

In step S1213, the signal switching section 16 disconnects the wiring connecting the observation points to the spare cells, and then, connects, by use of the wiring, each of the observation points to a spare cell both placed in the neighborhood thereof based on the received array information. After connecting, by use of the wiring, each of the observation points and the spare cells both placed in the neighborhood thereof, the signal switching section 16 creates a scan net list B indicating a connection relationship among circuits, their array positions and wiring among the circuits in the semiconductor integrated circuit in which each of the observation points and the spare cells both placed in the neighborhood thereof are connected to each other. After creating the scan net list B, the signal switching section 16 outputs the created scan net list B.

In this embodiment, the receiving section 110 receives the net list B indicating the connection relationship in the semiconductor integrated circuit which includes the main circuits as well as the spare cell having the scan flip-flop connected to the observation terminal. The list creation section 10 creates the observation net list B indicating the connection relationship among circuits in the semiconductor integrated circuit in which the observation points are provided in the main circuit shown in the net list B. The signal connection section 12 creates the connection net list B indicating the connection relationship in the semiconductor integrated circuit in which each of the observation points and each of the observation terminals shown by the observation net list B are connected to each other. The optimization section 15 lays out the semiconductor integrated circuit shown in the connection net list B, and creates the optimized layout net list B indicating the connection relationship among the circuits, their array positions and wiring among the circuits in the laid-out semiconductor integrated circuit. The coordinates extraction section 11 associates each of the observation points with each of the spare cell placed in the neighborhood of the concerned observation point. The signal switching section 16 disconnects the wiring connecting the observation points to the observation terminals, and connects each of the observation points to the observation terminal included in the spare cell placed in the neighborhood of the concerned observation point.

This creates the connection net list indicating the connection relationship in the semiconductor integrated circuit in which each of the observation points is connected to the observation terminal connected to the scan flip-flop. The semiconductor integrated circuit shown in the connection net list is laid out, and the wiring connecting the observation points to the observation terminals is thereafter disconnected. Thereafter, each of the observation points is connected, by the wiring, to the observation terminal included in the spare cell placed in the neighborhood of the concerned observation point.

Therefore, even if a net list which does not show the positions of circuits in a semiconductor integrated circuit is received, it is possible to shorten wiring between each observation point and each scan flip-flop. This makes it possible to reduce delay when a spare cell is used as a scan cell.

Moreover, in this embodiment, the list creation section 10 calculates the number of observation terminals shown in the net list B which the receiving section 110 receives, and provides the observation points of the number corresponding to the calculated number of observation terminals.

Thus, the observation points of the number corresponding to that of observation terminals are provided. Since this makes it possible to connect all observation terminals to the observation points when the spare cell is used as the scan cell, the spare cells can be used without waste.

Still moreover, in this embodiment, the list creation section 10 provides candidate points for observation points in the main circuit shown in the net list B, and calculates the number of flip-flops and that of gates, which are connected to the provided candidate points in the neighborhood thereof, for each candidate point. The list creation section 10 calculates the reference number of each candidate point from the calculated number of flip-flops and that of gates in accordance with the received calculation condition, and extracts the observation points of the number corresponding to that of observation terminals, in descending order of the calculated reference number of the candidate point.

As described above, the candidate points for the observation points are provided, the number of flip-flops and that of gates, which are connected to the candidate points in the neighborhood thereof, are calculated for each of the candidate points, and the reference number of each of the candidate points is calculated from the calculated number of flip-flops and that of gates. The candidate points are extracted as the observation points in descending order of the calculated reference number of the candidate point.

Accordingly, it is made possible to extract the candidate points as observation points in descending order of the number of flip-flops and that of gates, which are connected to the candidate point in the neighborhood thereof. As a result, when an observation point is provided at the portion where a large number of flip-flops and gates exist in the neighborhood thereof in the semiconductor integrated circuit, the operations of many gates can be tested by using one observation point, thereby causing failure testability to be increased.

Furthermore, in this embodiment, the delay constraint creation section 14 creates the delay constrained condition for reducing delay of the semiconductor integrated circuit shown in the received connection net list B. The optimization section 15 lays out the semiconductor integrated circuit shown in the received connection net list B so as to satisfy the delay constrained condition created by the delay constraint creation section 14.

Since this makes it possible to satisfy the delay constrained condition when the semiconductor integrated circuit is laid out, the delay of the semiconductor integrated circuit can be reduced.

When the test mode signal connection 13 calculates the failure testability of the semiconductor integrated circuit shown in the connection net list and the calculated failure testability is less than the target failure testability, the test mode signal connection 13 creates the terminal increase net list indicating the connection relationship among circuits in the semiconductor integrated circuit in which the number of observation terminals is increased. The list creation section 10 calculates the number of observation terminals shown in the terminal increase net list, and extracts, as the observation points, the candidate points of the number corresponding to the calculated number of observation terminals.

Since this makes it possible to increase the number of observation points when the failure testability is less than the target failure testability, the failure testability can be improved.

In the above-explained embodiments, each of the illustrated structures is merely an example, and the present invention is not limited to the structures.

What is claimed is:

1. An apparatus for designing a semiconductor integrated circuit having a main circuit as well as a spare cell including a scan flip-flop, comprising:
   receiving means which receives a net list indicating a connection relationship among circuits and their positions in a semiconductor integrated circuit;
   list creating means which creates an observation net list in which an observation point is provided in the net list;
   coordinates extracting means which associates the observation point with a spare cell placed in the neighborhood of the observation point; and
   signal connecting means which creates a scan net list in which the observation point is connected, by wiring, to the scan flip-flop included in the spare cell associated with the observation point.

2. The apparatus according to claim 1, wherein the list creating means calculates the number of scan flip-flops shown in the received net list, and provides the observation points of the number corresponding to the calculated number of scan flip-flops.

3. The apparatus according to claim 2, wherein
   the main circuit includes flip-flops and gates;
   the receiving means further receives a calculation condition used for calculating a reference number from the number of flip-flops and that of gates; and
   the list creating means provides a plurality of candidate points for an observation point in the main circuit after calculating the number of scan flip-flops, calculates the number of flip-flops and that of gates, which are connected to each of the candidate points in the neighborhood thereof, calculates a reference number of each of the candidate points from the calculated number of flip-flops and that of gates in accordance with the received calculation condition, and extracts, as the observation points, the candidate points of the number corresponding to the calculated number of scan flip-flops, in descending order of the calculated reference number of the candidate point.

4. A semiconductor integrated circuit design apparatus for designing a semiconductor integrated circuit having a main circuit as well as the spare cell including a scan flip-flop connected to an observation terminal, comprising:
   receiving means which receives a net list indicating a connection relationship among circuits in the semiconductor integrated circuit;
   list creating means which creates an observation net list where an observation point is provided in the net list;
   signal connecting means which creates a connection net list in which the observation point and the observation terminal in the observation net list are connected;
   layout means which lays out the semiconductor integrated circuit shown in the connection net list, and which creates a layout net list indicating a connection relationship among the circuits and their positions in the laid-out semiconductor integrated circuit;
   coordinates extracting means which associates the observation point with a spare cell placed in the neighborhood of the observation point; and
   signal switching means which disconnects wiring connecting between the observation point and the observation terminal connected by the signal connecting means, and which connects, by wiring, the observation point to an observation terminal included in the spare cell associated with the observation point by the coordinates extracting means.

5. The semiconductor integrated circuit design apparatus according to claim 4, wherein the list creating means calculates the number of observation terminals shown in the received net list, and provides the observation points of the number corresponding to the calculated number of observation terminals.

6. The semiconductor integrated circuit design apparatus according to claim 5, wherein
the main circuit includes flip-flops and gates;
the receiving means further receives a calculation condition used for calculating a reference number in the observation net list from the number of flip-flops and that of gates; and
the list creating means provides a plurality of candidate points for the observation point, after calculating the number of observation terminals, calculates the number of flip-flops and that of gates, which are connected to each of the candidate points in the neighborhood thereof, calculates a reference number of each of the candidate points from the calculated number of flip-flops and that of gates in accordance with the received calculation condition, and extracts, as the observation points, the candidate points of the number corresponding to the calculated number of observation terminals, in descending order of the calculated reference number of the candidate point.

7. The semiconductor integrated circuit design apparatus according to claim 5, further comprising:
storing means which stores target failure testability of the semiconductor integrated circuit; and
failure testability detecting means which calculates failure testability of the semiconductor integrated circuit shown in the created connection net list, which determines whether or not the calculated failure testability is not less than the target failure testability, which increases the number of observation terminals connected to the scan flip-flop shown in the created connection net list when the calculated failure testability is less than the target failure testability, and which creates an increase net list in which the number of observation terminals is increased, wherein
the list creating means calculates the number of observation terminals shown in the created increase net list, and provides the observation points of the number corresponding to the calculated number of observation terminals.

8. The semiconductor integrated circuit design apparatus according to claim 4, further comprising:
delay constraint creating means which creates a delay constrained condition for reducing delay of the semiconductor integrated circuit shown in the created connection net list, wherein
the layout means lays out the semiconductor integrated circuit shown in the connection net list so as to satisfy the delay constrained condition created by the delay constraint creating means.

9. A method for designing a semiconductor integrated circuit having a main circuit as well as the spare cell including a scan flip-flop, comprising the steps of:
receiving a net list indicating a connection relationship among circuits and positions in a semiconductor integrated circuit;
creating an observation net list in which an observation point is provided in the net list;
associating the observation point with a spare cell placed in the neighborhood of the observation point; and
creating a scan net list in which the observation point is connected, by wiring, to the scan flip-flop included in the spare cell associated with the observation point.

10. The method according to claim 9, further comprising the steps of:
calculating the number of scan flip-flops shown in the received net list; and
providing the observation points of the number corresponding to the calculated number of scan flip-flops.

11. The method according to claim 10, wherein the main circuit includes flip-flops and gates,
the semiconductor integrated circuit design method further comprising the steps of:
receiving a calculation condition used for calculating a reference number from the number of flip-flops and that of gates;
providing a plurality of candidate points for the observation point in the main circuit shown in the net list, after calculating the number of scan flip-flops;
calculating the number of flip-flops and that of gates, which are connected to each of the candidate points in the neighborhood thereof,
calculating a reference number of each of the candidate points from the calculated number of flip-flops and that of gates according to the calculation condition, and
extracting, as the observation points, the candidate points of the number corresponding to the number of scan flip-flops, in descending order of the reference number of the candidate points.

12. A method for designing a semiconductor integrated circuit for designing a semiconductor integrated circuit having a main circuit as well as the spare cell including a scan flip-flop connected to an observation terminal, comprising the steps of:
receiving a net list indicating a connection relationship among circuits in a semiconductor integrated circuit;
creating an observation net list in which an observation point is provided in the net list;
connecting the observation point to the observation terminal;
creating a connection net list in which the observation point and the observation terminal are connected;
creating a layout net list in which the semiconductor integrated circuit shown in the connection net list is laid out;
associating the observation point to a spare cell placed in the neighborhood of the observation point based on the layout net list;
disconnecting wiring connecting the observation point to the observation terminal laid-out; and
connecting, by wiring, the observation point to an observation terminal included in the spare cell associated with the observation point.

13. The method according to claim 12, further comprising the steps of:
calculating the number of observation terminals shown in the received net list; and
providing the observation points of the number corresponding to the number of observation terminals.

14. The method according to claim 13, wherein the main circuit includes flip-flops and gates,
the semiconductor integrated circuit design method further comprising the steps of:
receiving a calculation condition used for calculating a reference number from the number of flip-flops and that of gates;

providing a plurality of candidate points for the observation point after the number of observation terminals is calculated;

calculating the number of flip-flops and that of gates, which are connected to each of the candidate points in the neighborhood thereof;

calculating a reference number of each of the candidate points from the calculated number of flip-flops and that of gates according to the calculation condition; and extracting, as the observation points, the candidate points of the number corresponding to that of the observation terminals, in descending order of the reference number of the candidate points.

15. The method according to claim 13, further comprising the steps of;

calculating failure testability of the semiconductor integrated circuit shown in the created connection net list;

determining whether or not the failure testability is not less than a target failure testability of the semiconductor integrated circuit, increasing the number of observation terminals connected to the scan flip-flop shown in the created connection net list when the failure testability is less than the target failure testability, creating an increase net list in which the number of observation terminals is increased, calculating the number of observation terminals shown in the created increase net list; and providing the observation points of the number corresponding to the calculated number of observation terminals.

16. The method according to claim 12, further comprising the steps of:

creating a delay constrained condition for reducing delay of the semiconductor integrated circuit shown in the created connection net list; and laying out the semiconductor integrated circuit shown in the connection net list so as to satisfy the delay constrained condition.

* * * * *